(12) United States Patent
Barua et al.

(10) Patent No.: US 10,668,710 B2
(45) Date of Patent: Jun. 2, 2020

(54) COMPONENTS INCLUDING STRUCTURES HAVING DECOUPLED STRUCTURAL STIFFNESS AND MASS DENSITY

(71) Applicant: General Electric Company, Schenectady, NY (US)

(72) Inventors: Ananda Barua, Schenectady, NY (US); Arun Karthi Subramaniyan, Clifton Park, NY (US); Daniel Jason Erno, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 109 days.

(21) Appl. No.: 15/663,341

(22) Filed: Jul. 28, 2017

(65) Prior Publication Data

US 2019/0030879 A1   Jan. 31, 2019

(51) Int. Cl.
  *B33Y 50/00*   (2015.01)
  *B33Y 50/02*   (2015.01)
  (Continued)

(52) U.S. Cl.
  CPC ............... *B33Y 50/02* (2014.12); *A24C 5/38* (2013.01); *B22F 3/1055* (2013.01); *B29C 64/00* (2017.08);
  (Continued)

(58) Field of Classification Search
  CPC ......... B33Y 50/02; B33Y 30/00; B33Y 10/00; B33Y 80/00; E04C 2/365; B32B 37/146; B32B 3/12; B23H 2200/30
  See application file for complete search history.

(56) References Cited

U.S. PATENT DOCUMENTS 4,291,080 A * 9/1981 Ely ........................... B32B 3/12
   428/116
5,201,125 A * 4/1993 Shorten ................. A43B 1/0009
   36/28
(Continued)

FOREIGN PATENT DOCUMENTS

CN   104827602 A   8/2015
CN   106694884 A   5/2017
(Continued)

OTHER PUBLICATIONS

European Search Report for related Application No. 18182934.2, dated Apr. 20, 2019, 13 Pages.
(Continued)

*Primary Examiner* — Uyen Smet
(74) *Attorney, Agent, or Firm* — Armstrong Teasdale LLP (57) ABSTRACT

A component is provided. The component includes a structure including a plurality of unit cells joined together, each unit cell of the plurality of unit cells having a mass density substantially similar to the mass density of every other unit cell of the plurality of unit cells. The plurality of unit cells includes a first portion of unit cells having a characteristic dimension and a first portion average stiffness, the characteristic dimension of the first portion of unit cells having a first value. The plurality of unit cells also includes a second portion of unit cells having the characteristic dimension and a second portion average stiffness, the characteristic dimension of the second portion of unit cells having a second value different from the first value, wherein the second portion average stiffness differs from the first portion average stiffness.

16 Claims, 6 Drawing Sheets

(51) Int. Cl.

| | |
|---|---|
| *B33Y 10/00* | (2015.01) |
| *B29C 64/00* | (2017.01) |
| *F01N 13/16* | (2010.01) |
| *F01N 3/28* | (2006.01) |
| *B22F 3/105* | (2006.01) |
| *B33Y 30/00* | (2015.01) |
| *A24C 5/38* | (2006.01) |
| *E04C 2/36* | (2006.01) |
| *B23P 15/24* | (2006.01) |
| *B32B 37/14* | (2006.01) |
| *B22F 5/04* | (2006.01) |
| *B32B 3/12* | (2006.01) |
| *B33Y 80/00* | (2015.01) |
| *B22F 3/11* | (2006.01) |
| *B01D 46/24* | (2006.01) |
| *B29D 24/00* | (2006.01) |
| *B23K 11/00* | (2006.01) |
| *B29C 64/153* | (2017.01) |
| *B22F 5/10* | (2006.01) |
| *G06F 30/23* | (2020.01) |

(52) U.S. Cl.
CPC .............. *B33Y 10/00* (2014.12); *B33Y 30/00* (2014.12); *F01N 3/28* (2013.01); *F01N 13/16* (2013.01); *B01D 46/2418* (2013.01); *B22F 3/1112* (2013.01); *B22F 3/1115* (2013.01); *B22F 3/1118* (2013.01); *B22F 5/04* (2013.01); *B22F 5/10* (2013.01); *B22F 2003/1057* (2013.01); *B22F 2207/13* (2013.01); *B22F 2999/00* (2013.01); *B23H 2200/30* (2013.01); *B23K 11/0093* (2013.01); *B23P 15/243* (2013.01); *B29C 64/153* (2017.08); *B29D 24/005* (2013.01); *B32B 3/12* (2013.01); *B32B 37/146* (2013.01); *B33Y 80/00* (2014.12); *E04C 2/365* (2013.01); *F05D 2230/22* (2013.01); *F05D 2230/31* (2013.01); *F05D 2250/28* (2013.01); *F05D 2250/291* (2013.01); *G06F 30/23* (2020.01)

(56) References Cited

U.S. PATENT DOCUMENTS

| | | | |
|---|---|---|---|
| 9,390,702 | B2 | 7/2016 | Mathur |
| 2011/0226897 | A1 | 9/2011 | Padavano et al. |
| 2013/0000247 | A1 | 1/2013 | Sypeck |
| 2013/0171019 | A1 | 7/2013 | Gessler et al. |
| 2014/0127452 | A1 | 5/2014 | Dietz et al. |
| 2016/0237836 | A1* | 8/2016 | Harris ............... F01D 25/12 |
| 2017/0023310 | A1 | 1/2017 | Hemker et al. |
| 2017/0043883 | A1 | 2/2017 | Carney et al. |
| 2017/0120376 | A1* | 5/2017 | Cheverton ............ B33Y 50/02 |
| 2017/0184108 | A1* | 6/2017 | Scancarello ......... B33Y 10/00 |
| 2018/0229443 | A1* | 8/2018 | Pham .................. B29C 64/106 |

FOREIGN PATENT DOCUMENTS

| | | |
|---|---|---|
| EP | 3372395 A2 | 9/2018 |
| JP | H0625775 A | 2/1994 |
| JP | 10879893 A | 3/1996 |
| JP | H10205011 A | 8/1998 |
| JP | H10205012 A | 8/1998 |
| JP | 2007332401 A | 12/2007 |
| WO | 2013005163 A1 | 1/2013 |

OTHER PUBLICATIONS

Guo J et al., "Tailoring the elastic postbuckling response of thin-walled cylindrical shells for applications in mechanical devices and adaptive structures", Database Compendex [Online] Engineering Information, Inc., New York, NY, US; 2017, : XP002788487, Database accession No. E20174904489168 * abstract * & ASME 2017 Conference on Smart Materials, Adaptive Structures and Intelligent Systems, 2017 American Society of Mechanical Engineers USA, vol. 2, 2017, DOI: 10.1115/SMASIS2017-3967.

Guo et al., "Numerical Analysis on Static Mechanical Properties of the Periodic Multilayer Lattice Material", Engineering, vol. 3, Issue: 12, pp. 1149-1154, 2011.

Hedayatrasa et al., "On topology optimization of acoustic metamaterial lattices for locally resonant bandgaps of flexural waves", School of Engineering, University of South Australia, Mawson Lakes, SA 5095, Australia, pp. 7, 2016.

Japanese Office Action for related Application No. 2018138944, dated Dec. 18, 2019, 14 Pages.

\* cited by examiner

COMPONENTS INCLUDING STRUCTURES HAVING DECOUPLED STRUCTURAL STIFFNESS AND MASS DENSITY

BACKGROUND

The field of the disclosure relates generally to components, and, more particularly, to components including unit cells sized and arranged to create structures within the components with independent and decoupled structural stiffness and mass density.

Known components and structures are configured to carry loads during operation of the structures. The stiffness and mass density of the structures are coupled such that modifying either the stiffness or mass density of the structure will typically result in a change to the other of the stiffness and the mass density. Using different materials to create varying stiffness and mass density properties creates additional thermal expansion stress and the potential for corrosion increases, which can reduce the expected life of the components and increases the complexity of manufacturing the component and joining the materials within the structure. Accordingly, it is desirable to decouple the stiffness and mass density locally within a structure using a single material within the structure to facilitate creating multifunctional structures with optimized stiffness and mass distribution characteristics for the intended application.

BRIEF DESCRIPTION

In one aspect, a component is provided. The component includes a structure including a plurality of unit cells joined together, each unit cell of the plurality of unit cells having a mass density substantially similar to the mass density of every other unit cell of the plurality of unit cells. The plurality of unit cells includes a first portion of unit cells having a characteristic dimension and a first portion average stiffness, the characteristic dimension of the first portion of unit cells having a first value. The plurality of unit cells also includes a second portion of unit cells having the characteristic dimension and a second portion average stiffness, the characteristic dimension of the second portion of unit cells having a second value different from the first value, wherein the second portion average stiffness differs from the first portion average stiffness.

In another aspect, a component is provided. The component includes a structure including a plurality of unit cells joined together. The plurality of unit cells includes a first portion of unit cells having a characteristic dimension and a first portion mass density, the characteristic dimension of the first portion of unit cells having a first value. The plurality of unit cells also includes a second portion of unit cells having the characteristic dimension and a second portion mass density, the characteristic dimension of the second portion of unit cells having a second value different from the first value, wherein the second portion mass density differs from the first portion mass density, and wherein the second portion of unit cells has an average stiffness substantially similar to an average stiffness of the first portion of unit cells.

In yet another aspect, a method of fabricating a component with an additive manufacturing system including a consolidating device is provided. The method includes providing a build file of the component on a controller of the additive manufacturing system. The method also includes depositing a material onto a surface. The method further includes operating the consolidating device to consolidate the material to form a structure comprising a plurality of unit cells joined together, wherein the plurality of unit cells comprise a first portion of unit cells and a second portion of unit cells. The first portion of unit cells have a characteristic dimension, the characteristic dimension of the first portion of unit cells having a first value. The second portion of unit cells have the characteristic dimension, the characteristic dimension of the second portion of unit cells having a second value different from the first value.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. A value modified by the term "substantially similar", as used herein throughout the specification and claims, may be applied to modify any quantitative representation within a range of five percent of the referenced quantitative representation, and more particularly, within a range of one percent of the referenced quantitative representation. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The embodiments described herein facilitate manufacturing a component using an additive manufacturing process where the component includes a unit cell structure having decoupled structural stiffness and mass density properties. The unit cell structure has a characteristic dimension (i.e., length, width, height), and includes a plurality of unit cells coupled together within the component. Generally, the structural stiffness of a single unit cell is size independent, i.e., scaling the unit cell up or down (while maintaining the same proportions and therefore mass density) does not affect the mechanical properties of the unit cell. However, when unit cells are arranged as part of a structure defining a characteristic dimension, the effective structural stiffness of a given group of unit cells varies based on the number of unit cells along the characteristic length. The stiffness of the structure approaches a stable value as the number of unit cells is increased across the characteristic dimension of the structure, allowing the local stiffness of the structure to be optimized without modifying the average local mass density of the structure. Alternatively, the proportions (and therefore, the mass density) of the unit cells may be varied to maintain local stiffness within the structure while modifying the average local mass density within the structure.

The stiffness, k, of a body is a measure of the resistance offered by the body to deformation. For a body with a single degree of freedom (DOF) (i.e., compression, tension, bending, torsion), the stiffness is defined as $k=F/\delta$, where F represents the force on the body and $\delta$ represents the displacement produced by the force along the same DOF. The mass density, or volumetric mass density, of a body is its mass per unit volume, which is defined as $\rho=m/V$, where $\rho$ is the mass density of the body, m is the mass of the body, and V is the volume of the body. The average local stiffness of a structure is the stiffness for a defined region of the structure, an aggregate of unit cells, within a section of the structure. The average local mass density of a structure is the mass density for a defined region or portion of the structure, an aggregate of unit cells, within a section of the structure.

To vary the local stiffness, k, of the structure independent of the mass density of the structure, the size of the unit cells relative to the characteristic dimension of the structure is varied. The unit cells are scaled up or down to modify their size, maintaining the same mass density for each unit cell regardless of size. In order to vary the local mass density of the unit cell structure while maintaining local structural stiffness, the mass density of particular unit cells within the structure is varied by modifying variables such as wall thickness, and the unit cells are scaled to different sizes such that their effective stiffness in the global structure remains the same. Additionally, the unit cells structures may include a lattice cell structure configuration. Decoupling structural stiffness and mass density within a given unit cell structure facilitates manufacturing multifunctional unit cell structures that are lightweight with optimized structural stiffness and mass distribution characteristics.

Additive manufacturing processes and systems include, for example, and without limitation, vat photopolymerization, powder bed fusion, binder jetting, material jetting, sheet lamination, material extrusion, directed energy deposition and hybrid systems. These processes and systems include, for example, and without limitation, SLA—Stereolithography Apparatus, DLP—Digital Light Processing, 3SP—Scan, Spin, and Selectively Photocure, CLIP—Continuous Liquid Interface Production, SLS—Selective Laser Sintering, DMLS—Direct Metal Laser Sintering, SLM—Selective Laser Melting, EBM—Electron Beam Melting, SHS—Selective Heat Sintering, MJF—Multi-Jet Fusion, 3D Printing, Voxeljet, Polyjet, SCP—Smooth Curvatures Printing, MJM—Multi-Jet Modeling Projet, LOM—Laminated Object Manufacture, SDL—Selective Deposition Lamination, UAM—Ultrasonic Additive Manufacturing, FFF—Fused Filament Fabrication, FDM—Fused Deposition Modeling, LMD—Laser Metal Deposition, LENS—Laser Engineered Net Shaping, DMD—Direct Metal Deposition, Hybrid Systems, and combinations of these processes and systems. These processes and systems may employ, for example, and without limitation, all forms of electromagnetic radiation, heating, sintering, melting, curing, binding, consolidating, pressing, embedding, and combinations thereof.

Additive manufacturing processes and systems employ materials including, for example, and without limitation, polymers, plastics, metals, ceramics, sand, glass, waxes, fibers, biological matter, composites, and hybrids of these materials. These materials may be used in these processes and systems in a variety of forms as appropriate for a given material and the process or system, including, for example, and without limitation, as liquids, solids, powders, sheets, foils, tapes, filaments, pellets, liquids, slurries, wires, atomized, pastes, and combinations of these forms.

Figure 1:
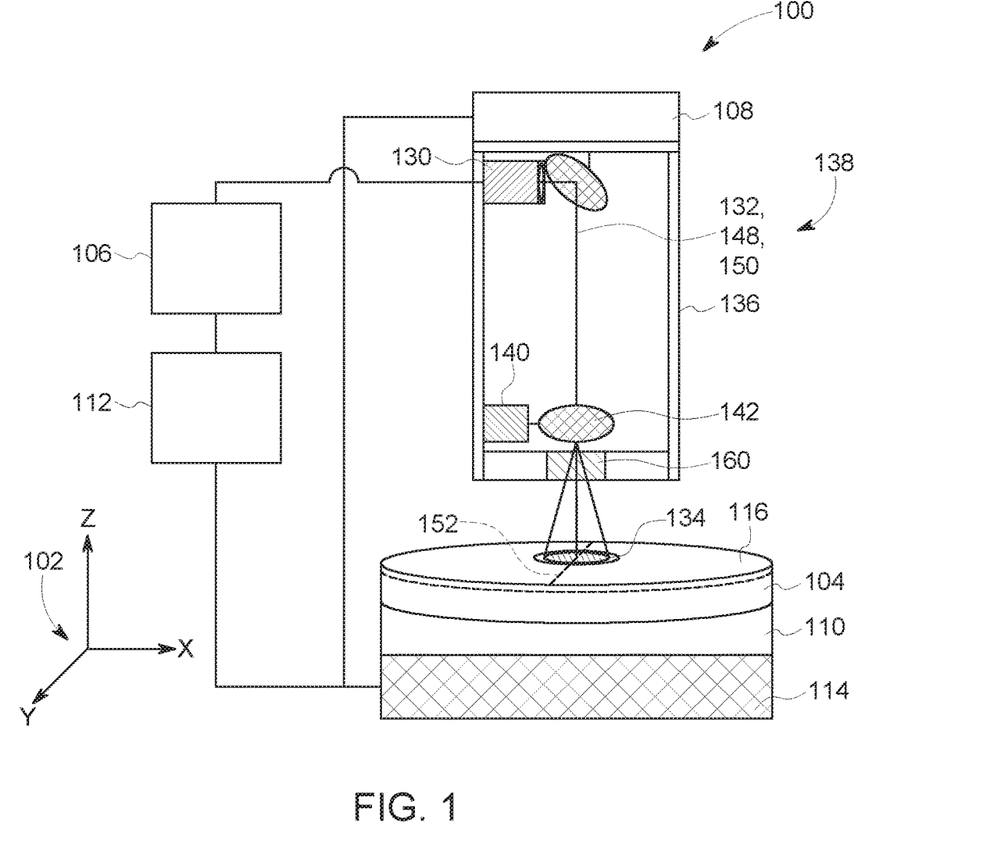
FIG. 1 is a schematic view of an additive manufacturing system.

FIG. 1 is a schematic view of an exemplary additive manufacturing system 100. A coordinate system 102 includes an x-axis, a y-axis, and a z-axis. In the exemplary embodiment, additive manufacturing system 100 includes a consolidating device 138 including a laser device 130, a scanning motor 140, a scanning mirror 142, and a scanning lens 160 for fabricating a component 104 using a layer-by-layer manufacturing process. Alternatively, consolidating device 138 may include any component that facilitates consolidation of a material using any of the processes and systems described herein. Laser device 130 provides a high-intensity heat source configured to generate a melt pool 134 (not shown to scale) in a powdered material using an energy beam 132. Laser device 130 is contained within a housing 136 that is coupled to a mounting system 108. Additive manufacturing system 100 also includes a computer control system, or controller 106. Mounting system 108 is moved by an actuator or an actuator system 112 that is configured to move mounting system 108 in an XY plane to cooperate with scanning mirror 142 to facilitate fabricating a layer of component 104 within additive manufacturing system 100. For example, and without limitation, mounting system 108 is pivoted about a central point, moved in a linear path, a curved path, and/or rotated to cover a portion of the powder on powder bed 110 to facilitate directing energy beam 132 along the surface of component 104. Alternatively, housing 136 and energy beam 132 are moved in any orientation and manner that enables additive manufacturing system 100 to function as described herein.

Scanning motor 140 is controlled by controller 106 and is configured to move scanning mirror 142 such that energy beam 132 is reflected to be incident along a predetermined path along powder bed 110, such as, for example, and without limitation, a linear and/or rotational scan path 152. In the exemplary embodiment, the combination of scanning motor 140 and scanning mirror 142 forms a two-dimension scan galvanometer. Alternatively, scanning motor 140 and scanning mirror 142 may include a three-dimension (3D) scan galvanometer, dynamic focusing galvanometer, and/or any other method that may be used to deflect energy beam 132 of laser device 130.

In the exemplary embodiment, powder bed 110 is mounted to a support structure 114, which is moved by actuator system 112. As described above with respect to mounting system 108, actuator system 112 is also configured to move support structure 114 in a Z direction (i.e., normal to a top surface of powder bed 110). In some embodiments, actuator system 112 is also configured to move support structure 114 in the XY plane. For example, and without limitation, in an alternative embodiment where housing 136 is stationary, actuator system 112 moves support structure 114 in the XY plane to cooperate with scanning motor 140 and scanning mirror 142 to direct energy beam 132 of laser device 130 along scan path 152 about powder bed 110. In the exemplary embodiment, actuator system 112 includes, for example, and without limitation, a linear motor(s), a hydraulic and/or pneumatic piston(s), a screw drive mechanism(s), and/or a conveyor system.

In the exemplary embodiment, additive manufacturing system 100 is operated to fabricate component 104 from a computer modeled representation of the 3D geometry of component 104. The computer modeled representation may be produced in a computer aided design (CAD) or similar file. The CAD file of component 104 is converted into a layer-by-layer format that includes a plurality of build parameters for each layer of component 104, for example, build layer 116 of component 104. In the exemplary embodiment, component 104 is modeled in a desired orientation relative to the origin of the coordinate system used in additive manufacturing system 100. The geometry of component 104 is sliced into a stack of layers of a desired thickness, such that the geometry of each layer is an outline of the cross-section through component 104 at that particular layer location. Scan paths 152 are generated across the geometry of a respective layer. The build parameters are applied along scan path 152 to fabricate that layer of component 104 from the material used to construct component 104. The steps are repeated for each respective layer of component 104 geometry. Once the process is completed, an electronic computer build file (or files) is generated, including all of the layers. The build file is loaded into controller 106 of additive manufacturing system 100 to control the system during fabrication of each layer.

After the build file is loaded into controller 106, additive manufacturing system 100 is operated to generate component 104 by implementing the layer-by-layer manufacturing process, such as a direct metal laser melting method. The exemplary layer-by-layer additive manufacturing process does not use a pre-existing article as the precursor to the final component, rather the process produces component 104 from a raw material in a configurable form, such as a powder. For example, and without limitation, a steel component can be additively manufactured using a steel powder. Additive manufacturing system 100 enables fabrication of components, such as component 104, using a broad range of materials, for example, and without limitation, metals, ceramics, glass, and polymers.

Figure 2:
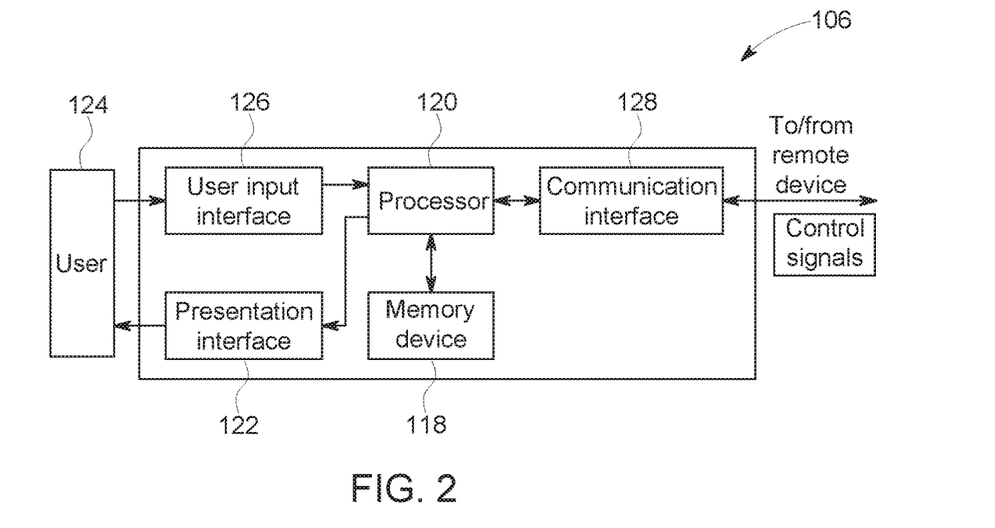
FIG. 2 is a block diagram of a controller that is used to operate the additive manufacturing system shown in FIG. 1.

FIG. 2 is a block diagram of controller 106 that is used to operate additive manufacturing system 100 (shown in FIG. 1). In the exemplary embodiment, controller 106 is any type of controller typically provided by a manufacturer of additive manufacturing system 100 to control operation of additive manufacturing system 100. Controller 106 executes operations to control the operation of additive manufacturing system 100 based at least partially on instructions from human operators. Controller 106 includes, for example, a 3D model of component 104 to be fabricated by additive manufacturing system 100. Operations executed by controller 106 include controlling power output of laser device 130 (shown in FIG. 1) and adjusting mounting system 108 and/or support structure 114, via actuator system 112 (all shown in FIG. 1) to control the scanning velocity of energy beam 132. Controller 106 is further configured to control deformable mirror 146, cylindrical beam expander 148, and beam rotation prism 150 to induce distortion in energy beam 132. Controller 106 is also configured to control scanning motor 140 to direct scanning mirror 142 to further control the scanning velocity of energy beam 132 within additive manufacturing system 100. In alternative embodiments, controller 106 may execute any operation that enables additive manufacturing system 100 to function as described herein.

In the exemplary embodiment, controller 106 includes a memory device 118 and a processor 120 coupled to memory device 118. Processor 120 may include one or more processing units, such as, without limitation, a multi-core configuration. Processor 120 is any type of processor that permits controller 106 to operate as described herein. In some embodiments, executable instructions are stored in memory device 118. Controller 106 is configurable to perform one or more operations described herein by programming processor 120. For example, processor 120 may be programmed by encoding an operation as one or more executable instructions and providing the executable instructions in memory device 118. In the exemplary embodiment, memory device 118 is one or more devices that enable storage and retrieval of information such as executable instructions or other data. Memory device 118 may include one or more computer readable media, such as, without limitation, random access memory (RAM), dynamic RAM, static RAM, a solid-state disk, a hard disk, read-only memory (ROM), erasable programmable ROM, electrically erasable programmable ROM, or non-volatile RAM memory. The above memory types are exemplary only, and are thus not limiting as to the types of memory usable for storage of a computer program.

Memory device 118 may be configured to store any type of data, including, without limitation, build parameters associated with component 104. In some embodiments, processor 120 removes or "purges" data from memory device 118 based on the age of the data. For example, processor 120 may overwrite previously recorded and stored data associated with a subsequent time or event. In addition, or alternatively, processor 120 may remove data that exceeds a predetermined time interval. In addition, memory device 118 includes, without limitation, sufficient data, algorithms, and commands to facilitate monitoring of build parameters and the geometric conditions of component 104 being fabricated by additive manufacturing system 100.

In some embodiments, controller 106 includes a presentation interface 122 coupled to processor 120. Presentation interface 122 presents information, such as the operating conditions of additive manufacturing system 100, to a user 124. In one embodiment, presentation interface 122 includes a display adapter (not shown) coupled to a display device (not shown), such as a cathode ray tube (CRT), a liquid crystal display (LCD), an organic LED (OLED) display, or an "electronic ink" display. In some embodiments, presentation interface 122 includes one or more display devices. In addition, or alternatively, presentation interface 122 includes an audio output device (not shown), for example, without limitation, an audio adapter or a speaker (not shown).

In some embodiments, controller 106 includes a user input interface 126. In the exemplary embodiment, user input interface 126 is coupled to processor 120 and receives input from user 124. User input interface 126 may include, for example, without limitation, a keyboard, a pointing device, a mouse, a stylus, a touch sensitive panel, such as, without limitation, a touch pad or a touch screen, and/or an audio input interface, such as, without limitation, a microphone. A single component, such as a touch screen, may function as both a display device of presentation interface 122 and user input interface 126.

In the exemplary embodiment, a communication interface 128 is coupled to processor 120 and is configured to be coupled in communication with one or more other devices, such as laser device 130, and to perform input and output operations with respect to such devices while performing as an input channel. For example, communication interface 128 may include, without limitation, a wired network adapter, a wireless network adapter, a mobile telecommunications adapter, a serial communication adapter, or a parallel communication adapter. Communication interface 128 may receive a data signal from or transmit a data signal to one or more remote devices. For example, in some embodiments, communication interface 128 of controller 106 may transmit/receive a data signal to/from actuator system 112.

Presentation interface 122 and communication interface 128 are both capable of providing information suitable for use with the methods described herein, such as, providing information to user 124 or processor 120. Accordingly, presentation interface 122 and communication interface 128 may be referred to as output devices. Similarly, user input interface 126 and communication interface 128 are capable of receiving information suitable for use with the methods described herein and may be referred to as input devices.

Figure 3:
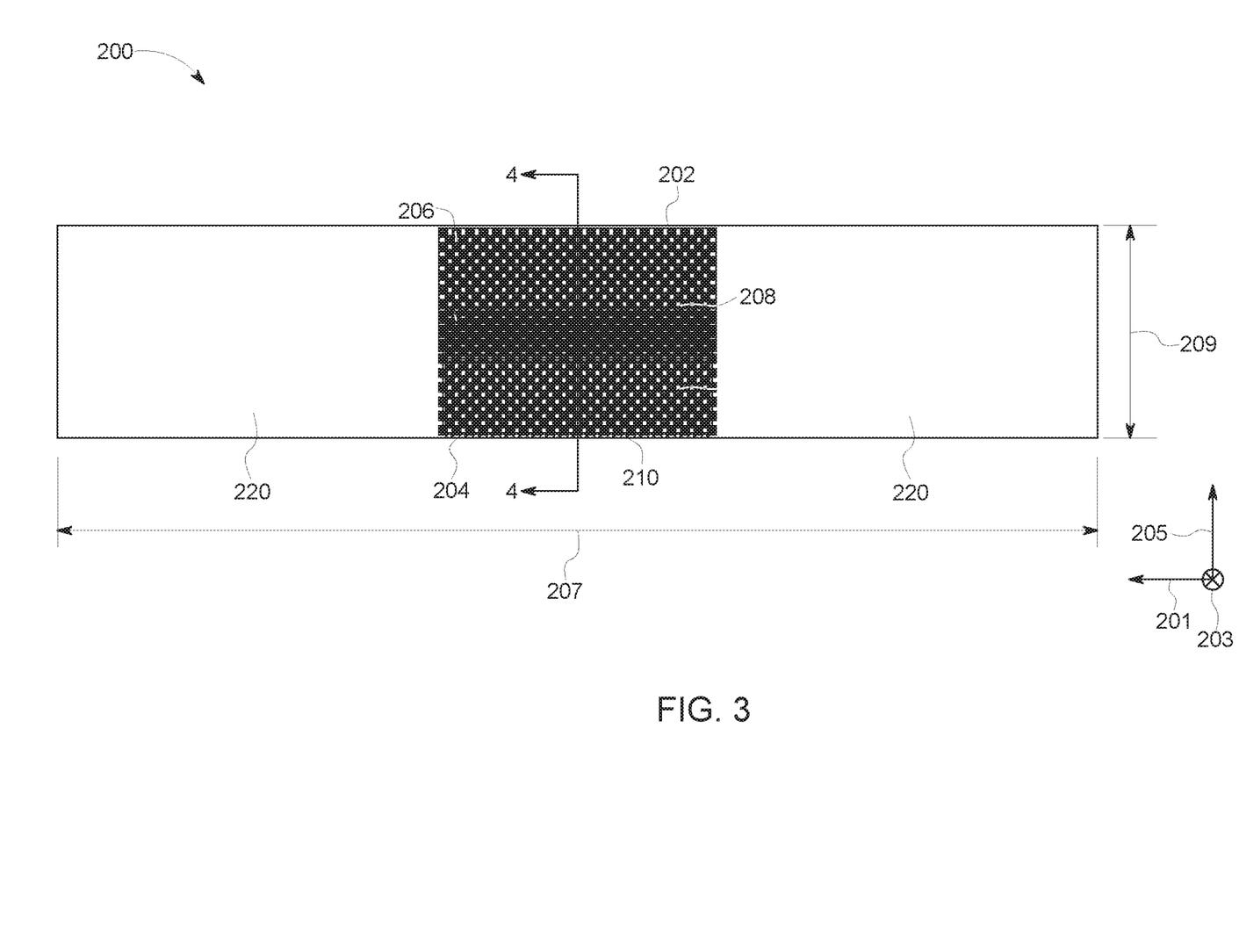
FIG. 3 is a side view of a component with a solid structure portion and an exemplary unit cell structure portion.
Figure 4:
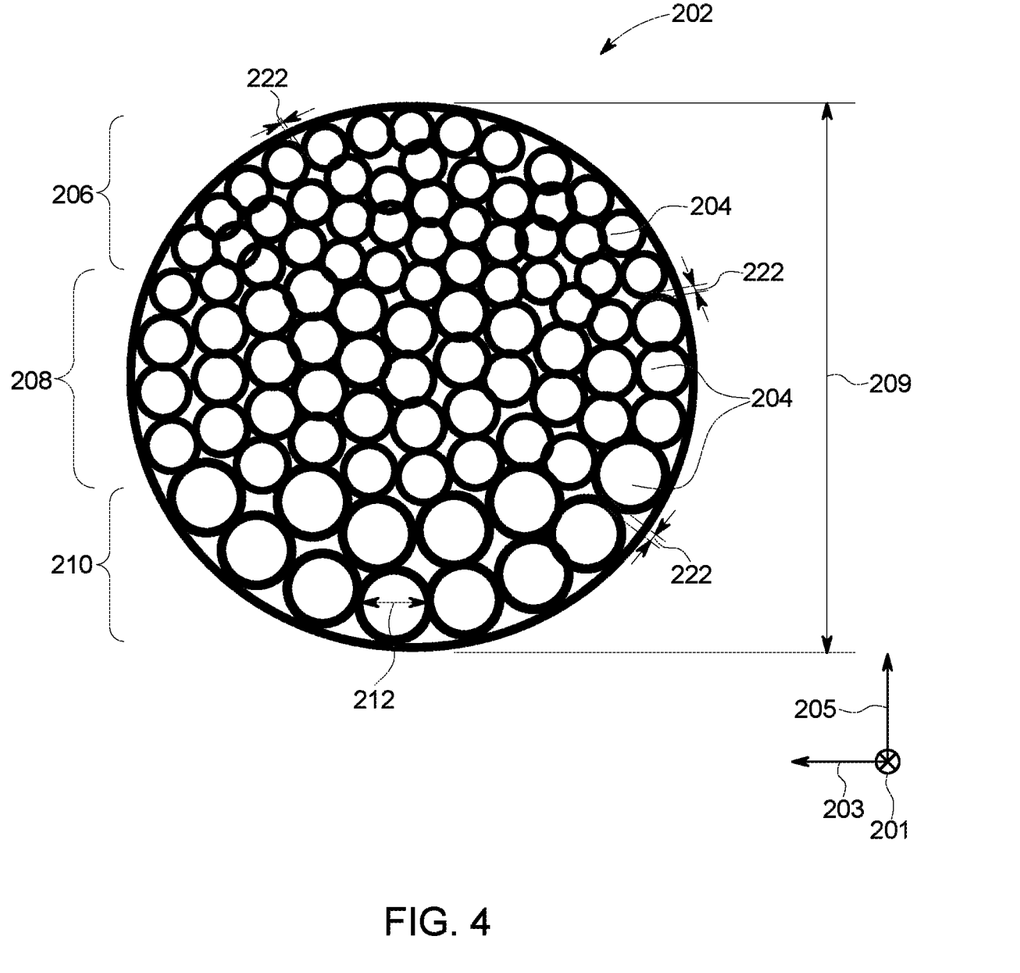
FIG. 4 is a section view of the unit cell structure taken about section line 4-4 of FIG. 3.

FIG. 3 is a side view of a component 200 with a solid structure portion 220 and an exemplary unit cell structure 202. FIG. 4 is a section view of unit cell structure 202 taken about section line 4-4 (shown in FIG. 3). Component 200 includes unit cell structure 202, which replaces a solid material or structure within component 200 and facilitates inclusion of a lightweight structure that is of a uniform mass density with varying structural stiffness. In the exemplary embodiment, component 200 defines a first, or length, dimension 207, and a second, or global, dimension 209. In the exemplary embodiment, global dimension 209 is a diameter of component 200. A longitudinal, or first, axis 201 of component 200 extends substantially parallel to first dimension 207. A transverse, or second, axis 203 extends normal to first axis 201. A vertical, or third, axis 205 extends in a direction that is normal to first axis 201 and normal to second axis 203. Accordingly, first axis 201, second axis 203, and third axis 205 are orthogonal to each other. In the exemplary embodiment, structure 202 includes a plurality of spherical unit cells 204 joined together, each unit cell 204 of the plurality of unit cells 204 having a mass density and a volume fraction substantially similar to the mass density and the volume fraction of each other unit cell 204 of the plurality of unit cells 204. In other alternative embodiments, global dimension 209 may be defined by any dimension of component 200 that enables component 200 to function as described herein.

In the exemplary embodiment, the plurality of unit cells 204 include a first portion 206 of unit cells 204 having a characteristic dimension 212. Characteristic dimension 212 may be, for example, a unit cell height, a unit cell width, a unit cell length, or a unit cell diameter. In the exemplary embodiment, characteristic dimension 212 is a diameter of unit cells 204. Characteristic dimension 212 of first portion 206 has a first value, the first value being the same for each unit cell 204 of first portion 206. The plurality of unit cells 204 also includes a second portion 208 of unit cells 204, each unit cell 204 of second portion 208 having characteristic dimension 212. Characteristic dimension 212 of second portion 208 has a second value, the second value being the same for each unit cell 204 of second portion 208. The plurality of unit cells 204 further includes a third portion 210 of unit cells 204, each unit cell 204 of third portion 210 having characteristic dimension 212. Characteristic dimension 212 of third portion 210 has a third value, the third value being the same for each unit cell 204 of third portion 210. In the exemplary embodiment, the third value for characteristic dimension 212 of third portion 210 is larger than the second value for characteristic dimension 212 of second portion 208. Additionally, the second value for characteristic dimension 212 of second portion 208 is larger than the first value for characteristic dimension 212 of first portion 206. In alternative embodiments, structure 202 may include as many portions of unit cells 204 as enables component 200 to function as described herein.

In the exemplary embodiment, the plurality of unit cells 204 are configured such that a stiffness of component 200 is varied throughout section 4-4 while the mass density of component 200 is consistent throughout section 4-4. More specifically, the average local structural stiffness of component 200 varies vertically across section 4-4 with respect to third axis 205. In the exemplary embodiment, varying the average local stiffness of component 200 is accomplished by varying the size, and therefore characteristic dimension 212, of unit cells 204. Unit cells 204 are scaled up or down to modify their size, while maintaining the same proportions and scale so that mass density for each unit cell 204 is substantially identical for each unit cell 204 of the plurality of unit cells 204 across section 4-4. For example, in the exemplary embodiment, unit cells 204 of first portion 206 are scale models of second portion 208 and third portion 210. More specifically, each spherical unit cell 204 has a wall thickness 222 and the ratio of wall thickness 222 to characteristic dimension (unit cell diameter) 212 is substantially equal for each of first portion 206, second portion 208, and third portion 210. The average local stiffness of a portion of unit cells 204 increases as the diameter of each scale unit cell 204 of the portion decreases. Thus, the average local stiffness of component 200 within structure 202 may be varied while maintaining the average local mass density of structure 202 by modifying the scale of each portion of unit cells 204 while maintaining the geometric scale relationships for each unit cell 204 to maintain the average local mass density of component 200.

In the exemplary embodiment, third portion 210 of unit cells 204 have a first average stiffness, second portion 208 of unit cells 204 have a second average stiffness that is greater than the first average stiffness of third portion 210, and first portion 206 of unit cells 204 have a third average stiffness that is greater than the second average stiffness of second portion 208. In alternative embodiments, first portion 206, second portion 208, and third portion 210 may have any stiffness that enables component 200 to function as described herein.

In the exemplary embodiment, the average local stiffness of component 200 varies across section 4-4 with respect to third axis 205 while the average local mass density remains constant throughout section 4-4. In the exemplary embodiment, varying the average local stiffness of structure 202 is accomplished by varying the scaled size of unit cells 204.

In the exemplary embodiment, structure 202 includes a plurality of spherical unit cells 204 joined together. In an alternative embodiment, structure 202 includes the plurality of unit cells 204 arranged as a lattice structure. In an alternative embodiment, structure 202 includes a plurality of lattice structure unit cells 204, wherein the unit cells 204 have a lattice shape of at least one of triclinic, monoclinic, orthorhombic, tetragonal, hexagonal, cubic, and spherical. In other alternative embodiments, structure 202 includes a plurality of unit cells having a beam structure. In yet another alternative embodiment, structure 202 includes any arrangement of unit cells 204 as enable component to function as described herein.

Figure 5:
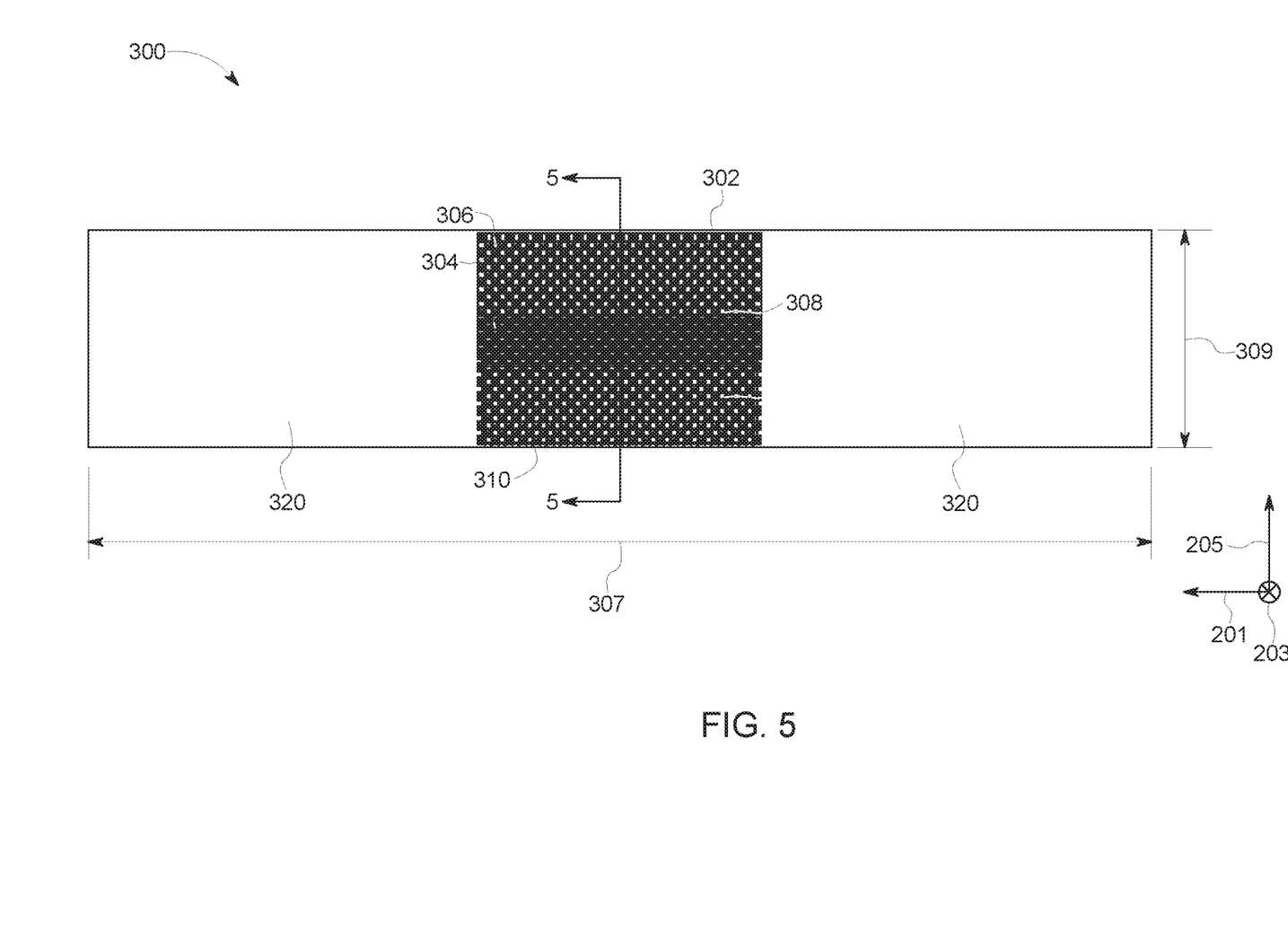
FIG. 5 is a side view of a component with a solid structure portion and another embodiment of an exemplary unit cell structure portion.
Figure 6:
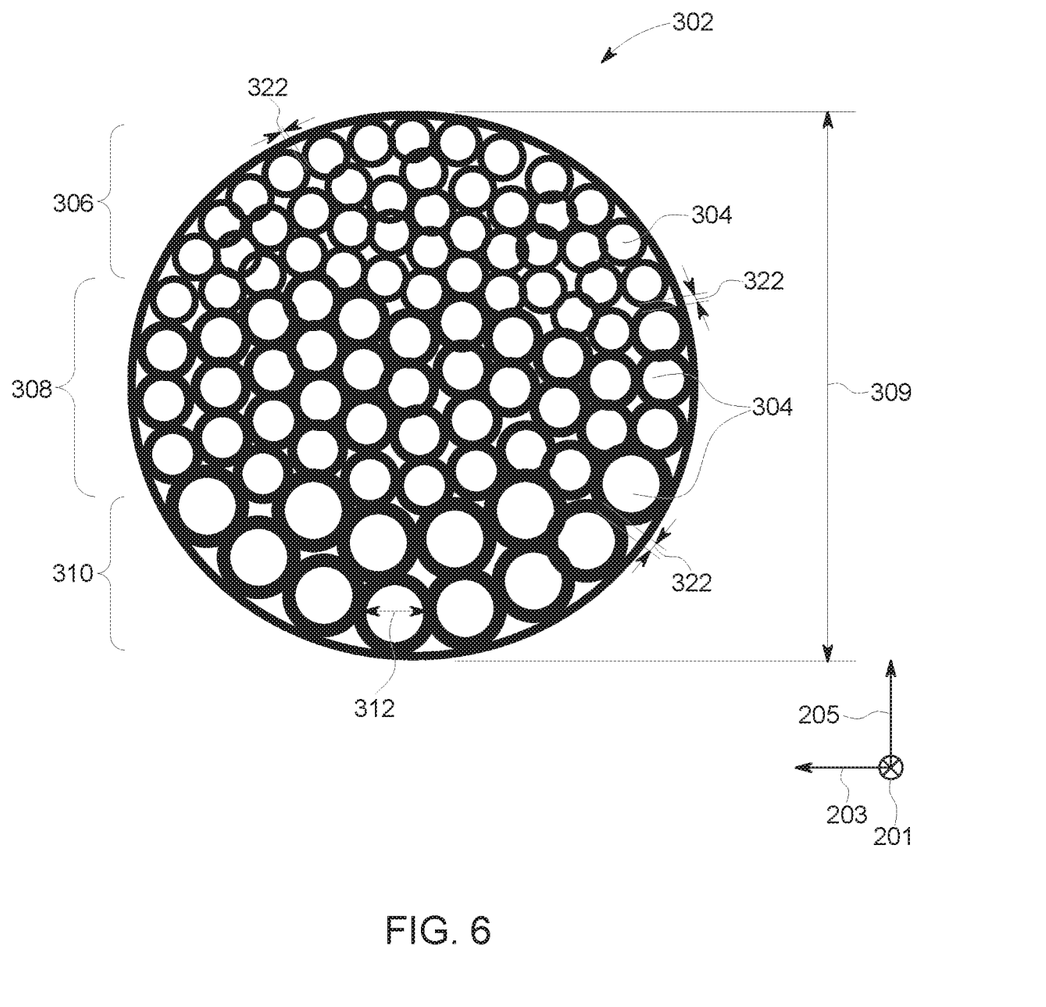
FIG. 6 is a section view of the unit cell structure taken about section line 5-5 of FIG. 5.

FIG. 5 is a side view of a component 300 with a solid structure portion 320 and an exemplary unit cell structure portion 302. FIG. 6 is a section view of unit cell structure 302 taken about section line 5-5 (shown in FIG. 5). Component 300 includes unit cell structure 302, which replaces a solid material or structure within component 300 and facilitates inclusion of a lightweight structure that is of a uniform mass density with varying structural stiffness. In the exemplary embodiment, component 300 defines a first, or length, dimension 307, and a second, or global, dimension 309. In the exemplary embodiment, global dimension 309 is a diameter of component 300. A longitudinal, or first, axis 301 of component 300 extends parallel to first dimension 307. A transverse, or second, axis 303 extends normal to first axis 301. A vertical, or third, axis 305 extends in a direction that is normal to first axis 301 and normal to second axis 303. Accordingly, first axis 301, second axis 303, and third axis 305 are orthogonal to each other. In other alternative embodiments, global dimension 309 may be defined by any dimension of component 300 that enables component 300 to function as described herein.

In the exemplary embodiment, structure 302 includes a plurality of spherical unit cells 304 joined together. The plurality of unit cells 304 include a first portion 306 of unit cells 304, each unit cell 304 of the plurality of unit cells 304 having a characteristic dimension 312 and a first portion mass density. Characteristic dimension 312 may be, for example, a unit cell height, a unit cell width, a unit cell length, or a unit cell diameter. In the exemplary embodiment, characteristic dimension 312 is a diameter of unit cells 304. Characteristic dimension 312 of first portion 306 has a first value, the first value being the same for each unit cell 304 of first portion 306.

In the exemplary embodiment, the plurality of unit cells 304 also includes a second portion 308 of unit cells 304, each unit cell 304 of second portion 308 having characteristic dimension 312 and a second portion mass density. Characteristic dimension 312 of second portion 308 has a second value, the second value being the same for each unit cell 304 of second portion 308. In the exemplary embodiment, the second portion mass density for each unit cell 304 of second portion 308 is greater than the first portion mass density for each unit cell 304 of first portion 306

The plurality of unit cells 304 further includes a third portion 310 of unit cells 304, each unit cell 304 of third portion 310 having characteristic dimension 312 and a third portion mass density. Characteristic dimension 312 of third portion 310 has a third value, the third value being the same for each unit cell 304 of third portion 310. In the exemplary embodiment, the second portion mass density for each unit cell 304 of second portion 308 is greater than the first portion mass density for each unit cell 304 of first portion 306. Additionally, the third value for characteristic dimension 312 of third portion 310 is larger than the second value for characteristic dimension 312 of second portion 308. Additionally, the second value for characteristic dimension 312 of second portion 308 is larger than the first value for characteristic dimension 312 of first portion 306. In alternative embodiments, structure 302 may include as many portions of unit cells 304 as enables component 300 to function as described herein.

In the exemplary embodiment, third portion 310 of unit cells 304 have a first average stiffness, second portion 308 of unit cells 304 have a second average stiffness that is substantially identical to the first average stiffness of third portion 310, and first portion 306 of unit cells 304 have a third average stiffness that is substantially equal to the second average stiffness of second portion 208. In alternative embodiments, first portion 306, second portion 308, and third portion 310 may have any average stiffness as enables component 300 to function as described herein.

In the exemplary embodiment, with reference to FIG. 6, the plurality of unit cells 304 are configured such that the local stiffness of component 300 is constant throughout section 5-5 while the mass density of component 300 varies throughout section 5-5 of structure 302. More specifically, in the exemplary embodiment, the average local mass density of component 300 varies across section 5-5 with respect to third axis 305 while the average local stiffness remains constant throughout section 5-5. In the exemplary embodiment, varying the average local mass density of structure 302 is accomplished by varying the proportions and size, including characteristic dimension 312, of unit cells 304. For example, in the exemplary embodiment, unit cells 304 of first portion 306 are not scale models of second portion 308 and third portion 310. More specifically, each spherical unit cell 304 has a wall thickness 322 and the ratio of wall thickness 322 to characteristic dimension (unit cell diameter) 312 differs between each of first portion 306, second portion 308, and third portion 310. Thus, the average local stiffness of component 300 within structure 302 may be maintained while varying the average local mass density of structure 302 by modifying the scale relationship between unit cells 304 and by modifying the geometric proportions of unit cells 304 to vary the average local mass density of component 300.

In the exemplary embodiment, structure 302 includes a plurality of spherical unit cells 304 joined together. In an alternative embodiment, structure 302 includes the plurality of unit cells 304 arranged as a lattice structure. In the alternative embodiment, structure 302 includes a plurality of lattice structure unit cells 304, wherein the unit cells 304 have a lattice shape of at least one of triclinic, monoclinic, orthorhombic, tetragonal, hexagonal, cubic, and spherical. In other alternative embodiments, structure 302 includes a plurality of unit cells having a beam structure. In yet another alternative embodiment, structure 302 includes any arrangement of unit cells 304 as enable component to function as described herein.

Figure 7:
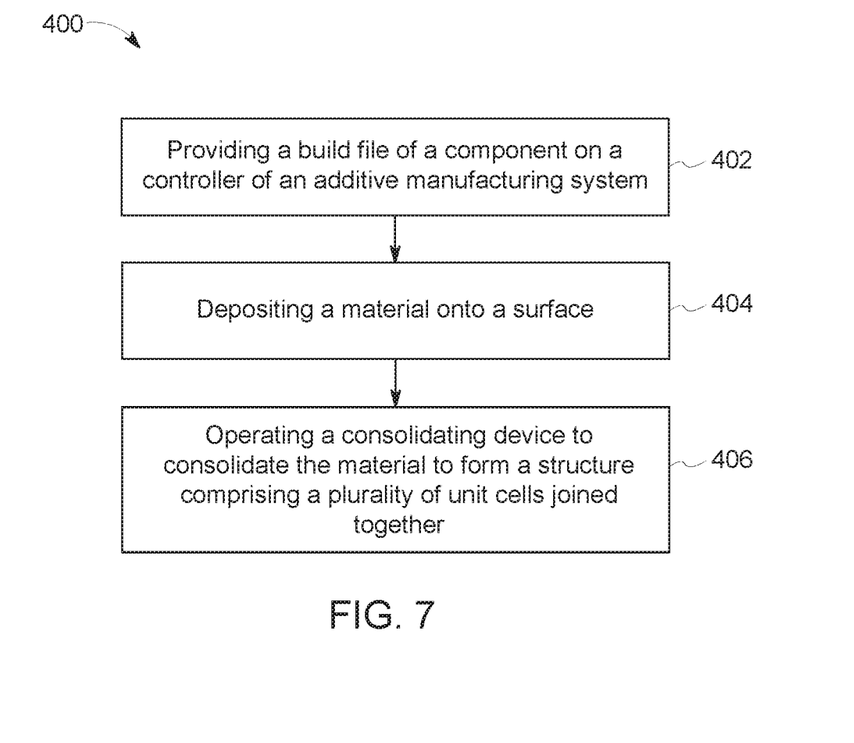
FIG. 7 is a flow chart illustrating a method for fabricating a component in a powder bed.

FIG. 7 is a flow chart illustrating a method 400 for fabricating component 104 with an additive manufacturing system 100 including a consolidating device 138. Referring to FIGS. 1, 2, and 7, method 400 includes providing 402 a build file of a component 104 on a controller 106 of an additive manufacturing system 100. Method 400 also includes depositing 404 a material onto a surface of component 104. Finally, method 400 further includes operating 406 the consolidating device 138 to consolidate the material to form at least a portion of a structure, or build layer 116, including a plurality of unit cells joined together.

The above-described unit cell structures provide an efficient method for decoupling structural stiffness and mass density within a component. Specifically, the unit cells are scaled up or down to modify their size, maintaining the same mass density for each unit cell regardless of size. In order to vary the local mass density of the unit cell structure while maintaining local structural stiffness, the mass density of particular unit cells within the structure is varied by modifying variables such as wall thickness, and the unit cells are scaled to different sizes such that their effective stiffness in the global structure remains the same. Decoupling structural stiffness and mass density within a given unit cell structure facilitates manufacturing multifunctional unit cell structures that are lightweight with optimized structural stiffness and mass distribution characteristics.

An exemplary technical effect of the methods, systems, and apparatus described herein includes at least one of: (a) replacing at least a portion of the solid structure of a component with a unit cell structure; (b) decoupling the structural stiffness and mass density of the structure; and (c) creating a component with optimized structural stiffness and mass distribution characteristics.

Exemplary embodiments of unit cell structures with decoupled structural stiffness and mass density are described above in detail. The unit cell structures, and methods of fabricating such components and structures are not limited to the specific embodiments described herein, but rather, components of systems and/or steps of the methods may be utilized independently and separately from other components and/or steps described herein. For example, the methods may also be used in combination with other components which require a unit cell internal structure, and are not limited to practice with only the systems and methods as described herein. Rather, the exemplary embodiment may be implemented and utilized in connection with many other manufacturing or construction applications that require a unit cell structure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A component comprising:
  a structure comprising a plurality of unit cells joined together in a three-dimensional lattice shape such that the lattice varies in the x-, y-, and z-dimensions, each unit cell of said plurality of unit cells having a mass density substantially similar to the mass density of every other unit cell of said plurality of unit cells, said plurality of unit cells comprising:
    a first portion of unit cells having a first portion characteristic dimension and a first portion average stiffness, the first portion characteristic dimension of said first portion of unit cells having a first value; and
    a second portion of unit cells having a second portion characteristic dimension and a second portion average stiffness, the second portion characteristic dimension of said second portion of unit cells having a second value different from the first value, wherein the second portion average stiffness differs from the first portion average stiffness.

2. The component in accordance with claim 1, wherein said structure comprises more than two portions of unit cells.

3. The component in accordance with claim 1, wherein the first portion and the second portion characteristic dimensions are one of a height, a width, a length, and a diameter.

4. The component in accordance with claim 1, wherein said component comprises at least a first section and a second section, wherein said first section comprises a unit cell structure, and wherein said second section comprises a solid structure.

5. The component in accordance with claim 4, wherein said first section comprises a first material, and wherein said second section comprises a second material.

6. The component in accordance with claim 1, wherein said three-dimensional lattice shape comprises unit cells having at least one of a triclinic, a monoclinic, an orthorhombic, a tetragonal, a hexagonal, a cubic, and a spherical shape.

7. A method of fabricating a component with an additive manufacturing system including a consolidating device, said method comprising:
   providing a build file of the component on a controller of the additive manufacturing system;
   depositing a material onto a surface; and
   operating the consolidating device to consolidate the material to form a structure comprising a plurality of unit cells joined together in a three-dimensional lattice shape such that the lattice varies in the x-, y-, and z-dimensions, wherein the plurality of unit cells comprise:
      a first portion of unit cells having a first portion characteristic dimension, the first portion characteristic dimension of the first portion of unit cells having a first value; and
      a second portion of unit cells having a second portion characteristic dimension, the second portion characteristic dimension of the second portion of unit cells having a second value different from the first value.

8. The method of claim 7, wherein fabricating the component comprises operating the consolidating device to consolidate the material to form at least a first section and a second section, and wherein the first section comprises a unit cell structure and the second section comprises a solid structure.

9. The method of claim 8, wherein operating the consolidating device further comprises forming a plurality of unit cells having a mass density substantially similar to the mass density of every other unit cell of the plurality of unit cells.

10. The method of claim 8, wherein operating the consolidating device to consolidate the material further comprises forming a plurality of unit cells having at least one of a triclinic, a monoclinic, an orthorhombic, a tetragonal, a hexagonal, a cubic, and a spherical shape.

11. A component comprising:
   a structure comprising a plurality of spherical unit cells joined together, each unit cell of said plurality of spherical unit cells having a mass density substantially similar to the mass density of every other spherical unit cell of said plurality of spherical unit cells, said plurality of spherical unit cells comprising:
      a first portion of spherical unit cells having a first portion characteristic dimension and a first portion average stiffness, the first portion characteristic dimension of said first portion of spherical unit cells having a first value; and
      a second portion of spherical unit cells having a second portion characteristic dimension and a second portion average stiffness, the second portion characteristic dimension of said second portion of spherical unit cells having a second value different from the first value, wherein the second portion average stiffness differs from the first portion average stiffness.

12. The component in accordance with claim 11, wherein said structure comprises more than two portions of spherical unit cells.

13. The component in accordance with claim 11, wherein the first portion and the second portion characteristic dimensions are one of a height, a width, a length, and a diameter.

14. The component in accordance with claim 11, wherein said component comprises at least a first section and a second section, wherein said first section comprises a unit cell structure, and wherein said second section comprises a solid structure.

15. The component in accordance with claim 14, wherein said first section comprises a first material, and wherein said second section comprises a second material.

16. The component in accordance with claim 14, wherein said first section comprises a lattice structure of said plurality of unit cells.

* * * * *